US009767892B1

(12) United States Patent
Kumar et al.

(10) Patent No.: US 9,767,892 B1
(45) Date of Patent: Sep. 19, 2017

(54) MEMORY ELEMENTS WITH DYNAMIC PULL-UP WEAKENING WRITE ASSIST CIRCUITRY

(71) Applicant: Altera Corporation, San Jose, CA (US)

(72) Inventors: Rajiv Kumar, Penang (MY); Wei Yee Koay, Bayan Lepas (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 15/140,188

(22) Filed: Apr. 27, 2016

(51) Int. Cl.
*G11C 11/419* (2006.01)
*G11C 7/06* (2006.01)

(52) U.S. Cl.
CPC ............ *G11C 11/419* (2013.01); *G11C 7/065* (2013.01)

(58) Field of Classification Search
CPC .............................. G11C 7/065; G11C 11/419
USPC ................................................ 365/154, 205
See application file for complete search history.

(56) References Cited

U.S. PATENT DOCUMENTS

| | | | |
|---|---|---|---|
| 5,128,731 A | 7/1992 | Lien et al. | |
| 5,145,799 A | 9/1992 | Rodder | |
| 5,324,961 A | 6/1994 | Rodder | |
| 5,530,378 A * | 6/1996 | Kucharewski, Jr. | H03K 19/1737 326/39 |
| 6,122,200 A * | 9/2000 | Campardo | G11C 16/08 365/185.18 |
| 6,479,310 B1 * | 11/2002 | Paterno | G01R 31/3185 257/E23.179 |
| 6,798,740 B1 * | 9/2004 | Senevirathne | H04L 1/20 370/219 |
| 6,819,612 B1 | 11/2004 | Achter | |
| 6,906,937 B1 * | 6/2005 | Nataraj | G11C 15/04 365/154 |
| 7,019,999 B1 * | 3/2006 | Srinivasan | G11C 15/04 365/168 |
| 7,449,753 B2 | 11/2008 | Wang et al. | |
| 7,920,410 B1 | 4/2011 | Lee et al. | |
| 8,081,502 B1 | 12/2011 | Rahim et al. | |
| 8,369,175 B1 | 2/2013 | Liu et al. | |
| 8,482,963 B1 | 7/2013 | Liu et al. | |
| 8,503,221 B1 | 8/2013 | Hobson et al. | |
| 2001/0050576 A1 | 12/2001 | Gilliam | |
| 2003/0090285 A1 | 5/2003 | Sher et al. | |
| 2007/0070773 A1 * | 3/2007 | Houston | G11C 11/413 365/229 |

(Continued)

OTHER PUBLICATIONS

Sinha et al., U.S. Appl. No. 14/492,450, filed Sep. 22, 2014.

*Primary Examiner* — Michael Tran
(74) *Attorney, Agent, or Firm* — Treyz Law Group, P.C.; Jason Tsai

(57) ABSTRACT

Integrated circuits with an array of memory cells are provided. Each memory cell may include at least one pair of cross-coupled inverters, write access transistors, and optionally a separate read port. The cross-coupled inverters in each memory cell may have a positive power supply terminal. The positive power supply terminal of each memory cell along a given column in the array may be coupled to a corresponding pull-up transistor. The pull-up transistor may receive a control signal from a pull-up weakening control circuit. The control signal may be temporarily elevated during write operations and may otherwise be driven back down to ground to help optimize read performance. The pull-up weakening control circuit may be implemented using a chain of n-channel transistors or a resistor chain.

19 Claims, 8 Drawing Sheets

(56) References Cited

U.S. PATENT DOCUMENTS

| | | | |
|---|---|---|---|
| 2007/0159876 A1* | 7/2007 | Sugibayashi | G11C 11/16 365/158 |
| 2008/0031045 A1* | 2/2008 | Liaw | G11C 5/14 365/185.07 |
| 2008/0043538 A1* | 2/2008 | Sugawara | G11C 8/08 365/185.23 |
| 2008/0106963 A1* | 5/2008 | Wang | G11C 11/418 365/207 |
| 2009/0059685 A1* | 3/2009 | Houston | G11C 11/413 365/189.09 |
| 2009/0109768 A1* | 4/2009 | Lee | H01L 27/1104 365/190 |
| 2009/0146686 A1* | 6/2009 | Voogel | G06F 15/7867 326/38 |
| 2010/0180150 A1* | 7/2010 | Jeddeloh | G06F 11/073 714/5.1 |
| 2012/0044779 A1* | 2/2012 | Chuang | G11C 11/412 365/226 |
| 2012/0063211 A1* | 3/2012 | Sharma | G11C 7/06 365/154 |
| 2012/0129301 A1* | 5/2012 | Or-Bach | G11C 8/16 438/129 |
| 2012/0140552 A1* | 6/2012 | Seikh | G11C 11/413 365/156 |
| 2012/0195111 A1* | 8/2012 | Ramaraju | G11C 11/412 365/156 |
| 2012/0228714 A1 | 9/2012 | Lim et al. | |
| 2013/0094307 A1 | 4/2013 | Cheng et al. | |
| 2013/0141962 A1* | 6/2013 | Liaw | G11C 11/412 365/154 |
| 2013/0315055 A1* | 11/2013 | Nakano | H04L 1/0003 370/225 |
| 2014/0003132 A1* | 1/2014 | Kulkarni | G11C 7/227 365/154 |
| 2014/0169074 A1 | 6/2014 | Sinha et al. | |
| 2014/0211551 A1* | 7/2014 | Kim | G11C 29/4401 365/158 |
| 2016/0372476 A1* | 12/2016 | Hung | H01L 29/7851 |

* cited by examiner

MEMORY ELEMENTS WITH DYNAMIC PULL-UP WEAKENING WRITE ASSIST CIRCUITRY

BACKGROUND

This relates to integrated circuits with memory and, more particularly, to volatile memory elements.

Integrated circuits often contain volatile memory elements. A volatile memory element retains data only so long as the integrated circuit is powered. In the event of power loss, the data in the volatile memory element is lost. Although nonvolatile memory elements such as memory elements based on electrically-erasable programmable read-only memory technology are not subject to data loss in this way, it is often not desirable or possible to fabricate non-volatile memory elements as part of a given integrated circuit.

As a result, volatile memory elements are often used. For example, static random-access memory (SRAM) chips contain SRAM cells, which are a type of volatile memory element. In programmable logic device integrated circuits, SRAM cells may serve as configuration random access memory (CRAM) cells. Programmable logic devices are a type of integrated circuit that can be programmed by a user to implement a desired custom logic function. CRAM cells are used to store configuration data supplied by the user. Once loaded, CRAM cells supply control signals to transistors to configure the transistors to implement the desired logic function.

Volatile memory elements such as SRAM and CRAM cells are typically based on cross-coupled inverters (latches). In each memory element, the cross-coupled inverters are connected to an address transistor that is turned on when data is being read from or written into the memory element. When no data is being read from or written into the memory element, the address transistor is turned off to isolate the memory element.

As semiconductor technology scales towards smaller sizes, lower power supply voltages may be used to power integrated circuits. Lower power supply voltages and smaller devices may lead to decreased read and write margins for volatile memory elements. This can pose challenges for reliable device operation.

SUMMARY

Integrated circuits with memory cells are provided. Integrated circuits may include control circuitry that controls a memory cell array. The control circuitry may include circuitry such as addressing circuitry, data register circuitry, and read/write circuitry.

The memory cell array may include groups of memory cells arranged in rows and columns. Each memory cell may have a bistable storage portion that includes at least first and second cross-coupled inverting circuits. The inverting circuits may each have a positive power supply terminal. In accordance with an embodiment, the positive power supply terminals of the inverting circuits within memory cells arranged along a given column may be coupled to only one corresponding pull-up weakening transistor (e.g., a single p-channel transistor may be shared among a column of memory cells).

The pull-up transistor associated with each column of memory cells may all receive a control signal from a pull-up weakening control circuit. The control signal may be driven to a ground power supply voltage level during read operations to help maximize read performance and may be temporarily adjusted to be greater than the ground power supply voltage level during write operations so as to temporarily weaken the pull-up transistors.

The pull-up weakening control circuit may be configured in a first mode in which the control signal is biased to a first predetermined voltage level during write operations or in a second mode in which the control signal is biased to a second predetermined voltage level that is different than the first predetermined voltage level during write operations. In one variation, the pull-up weakening control circuit may include a chain of diode-connected re-channel transistors coupled in series. In another variation, the pull-up weakening control circuit may include a chain of resistors coupled in series.

The pull-up weakening control circuit may be controlled by a write track signal. The write track signal may be generated using a digital flip-flop (as an example). The flip-flop may receive a write enable signal at a data input, a clock signal at a clock input, and a self-timed write done signal at a reset input. Configured in this way, the write track signal may be asserted following a rising edge in the clock signal (assuming the write enable signal is asserted) until the end of the write operation, which is signaled by the write done signal.

Further features of the present invention, its nature and various advantages will be more apparent from the accompanying drawings and the following detailed description.

DETAILED DESCRIPTION

This relates to integrated circuit memory elements that exhibit improved write margins without affecting read margins. The memory elements, which are sometimes referred to as cells, may contain any suitable number of transistors. For example, a memory cell may include two cross-coupled inverting circuits, three cross-coupled inverting circuits, four cross-coupled inverting circuits, or more than four cross-coupled inverting circuits that are coupled to one or more access transistors. If desired, the voltage levels that are associated with power supply signals, control signals, transistor body biasing signals, and/or data signals for the memory cells can be adjusted in real time to enhance performance.

The memory elements can be used in any suitable integrated circuits that use memory. These integrated circuits may be memory chips, digital signal processing circuits with memory arrays, microprocessors, application specific integrated circuits with memory arrays, programmable integrated circuits such as programmable logic device integrated circuits in which memory elements are used for configuration memory, or any other suitable integrated circuit. For clarity, the present invention will sometimes be described in the context of programmable logic device integrated circuits. This is, however, merely illustrative. Memory cells in accordance with embodiments of the present invention may be used in any suitable circuits.

On integrated circuits such as memory chips or other circuits in which memory is needed to store processing data, memory elements that perform the functions of static random-access memory (RAM) cells and are sometimes referred to as SRAM cells. In the context of programmable logic device integrated circuits, the memory elements can be used to store configuration data and are therefore sometimes referred to in this context as configuration random-access memory (CRAM) cells.

Figure 1:
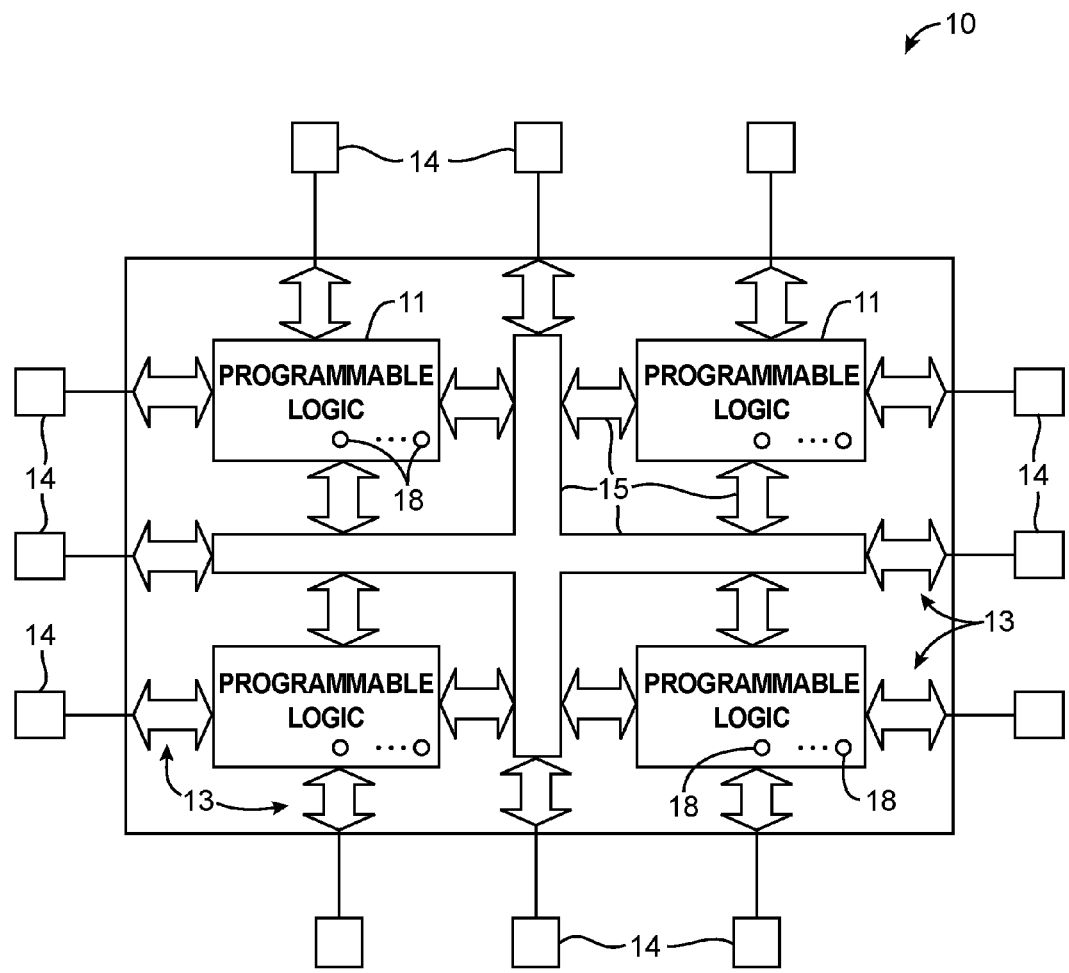
FIG. 1 is a diagram of an illustrative programmable integrated circuit in accordance with an embodiment.

An illustrative integrated circuit such as a programmable logic device 10 in accordance with an embodiment of the present invention is shown in FIG. 1.

Device 10 may have input/output circuitry 13 for driving signals off of device 10 and for receiving signals from other devices via input/output pins 14. Interconnection resources 16 such as global and local vertical and horizontal conductive lines and busses may be used to route signals on device 10. Interconnection resources 16 include fixed interconnects (conductive lines) and programmable interconnects (i.e., programmable connections between respective fixed interconnects). Programmable logic 11 may include combinational and sequential logic circuitry. The programmable logic 11 may be configured to perform a custom logic function. The programmable interconnects associated with interconnection resources may be considered to be a part of programmable logic 11.

Programmable logic device 10 contains volatile memory elements 18 that can be loaded with configuration data (also called programming data) using pins 14 and input-output circuitry 13. Once loaded, the memory elements each provide a corresponding static control output signal that controls the state of an associated logic component in programmable logic 11. If desired, memory elements 18 may be used in SRAM-type memory arrays (e.g., to store data for processing circuitry during operation of device 10).

Each memory element 18 may be formed from a number of transistors configured to form a bistable circuit. With one suitable approach, complementary metal-oxide-semiconductor (CMOS) integrated circuit technology is used to form the memory elements 18, so CMOS-based memory element implementations are described herein as an example. If desired, other integrated circuit technologies may be used to form the memory elements and the integrated circuit in which the memory elements are used to form memory arrays.

The memory elements may be loaded from an external erasable-programmable read-only memory and control chip or other suitable data source via pins 14 and input/output circuitry 13. Loaded CRAM memory elements 18 may provide static control signals that are applied to the terminals (e.g., gates) of circuit elements (e.g., metal-oxide-semiconductor transistors) in programmable logic 11 to control those elements (e.g., to turn certain transistors on or off) and thereby configure the logic in programmable logic 11. The circuit elements may be transistors such as pass transistors, parts of multiplexers, look-up tables, logic arrays, AND, OR, NAND, and NOR logic gates, etc.

The memory elements 18 may be arranged in an array pattern. In a typical modern programmable logic device, there may be millions of memory elements 18 on each chip. During programming operations, the array of memory elements is provided with configuration data by a user (e.g., a logic designer). Once loaded with configuration data, the memory elements 18 selectively control portions of the circuitry in the programmable logic 11 and thereby customize its functions so that it will operate as desired.

The circuitry of device 10 may be organized using any suitable architecture. As an example, the logic of programmable logic device 10 may be organized in a series of rows and columns of larger programmable logic regions each of which contains multiple smaller logic regions. The logic resources of device 10 may be interconnected by interconnection resources 15 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

Figure 2:
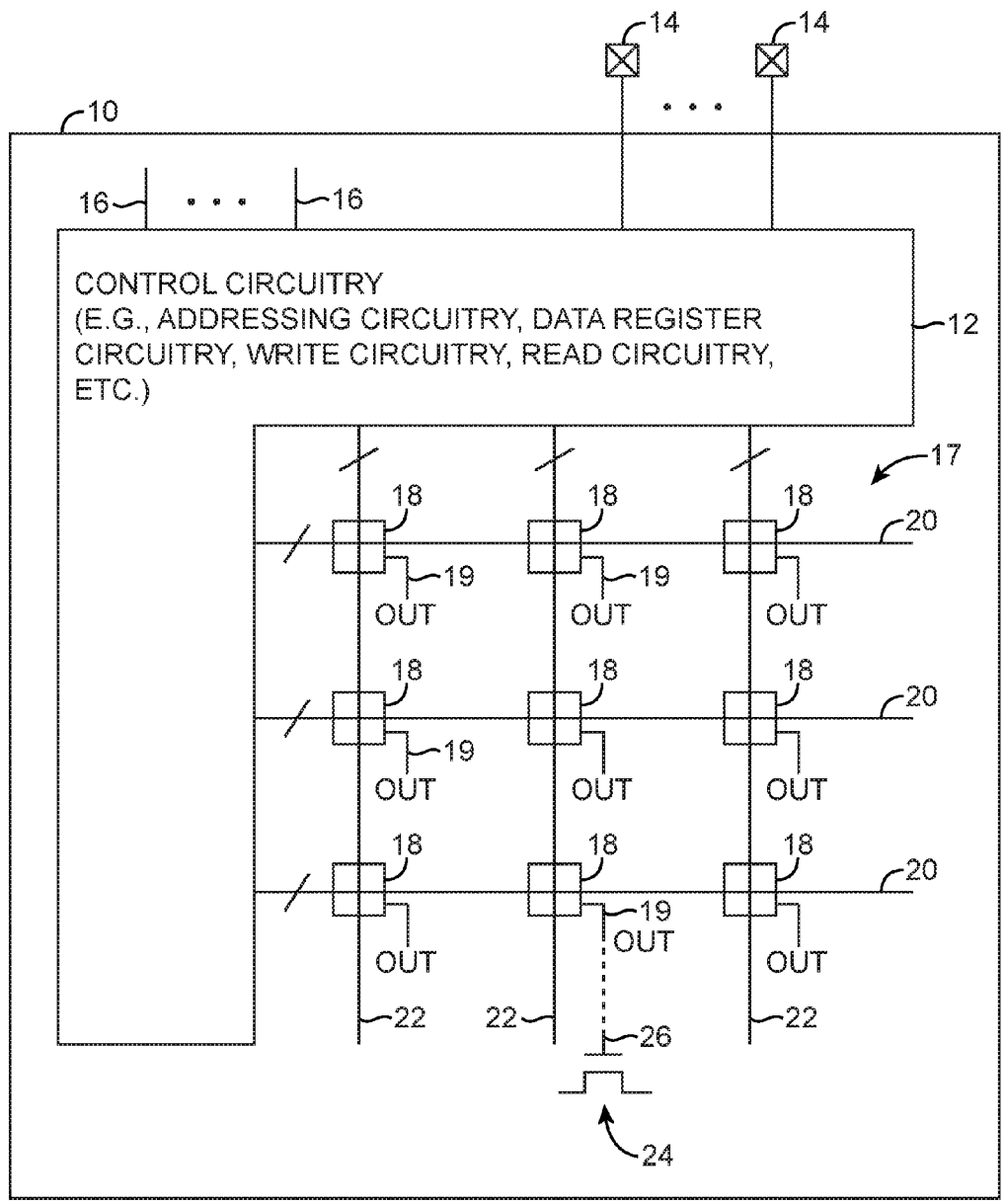
FIG. 2 is a diagram of an illustrative memory element array in accordance with an embodiment.

When memory elements 18 are arranged in an array, horizontal and vertical conductors and associated loading circuitry may be used to load the memory elements with configuration data. Any suitable memory array architecture may be used for memory elements 18. One suitable arrangement is shown in FIG. 2. There are only three rows and columns of memory cells 18 in the illustrative array of FIG. 2, but in general there may be hundreds or thousands of rows and columns in memory array 17. Array 17 may be one of a number of arrays on a given device 10, may be a subarray that is part of a larger array, or may be any other suitable group of memory cells 18.

Each memory element 18 may be formed from a number of transistors configured to form a bistable circuit (e.g., a latch-type circuit). True and complement data storage nodes in the bistable circuit element can store corresponding true and complement versions of a data bit.

A bistable circuit element may be based on any suitable number of transistors. For example, the bistable portion of each memory element may be formed from cross-coupled inverters, from groups of multiple inverter-like circuits (e.g., in a distributed configuration that provides enhanced immunity from soft-error-upset events, etc.). Arrangements with bistable elements formed from cross-coupled inverting pairs are sometimes described herein as an example. This is, however, merely illustrative. Memory elements 18 may be formed using any suitable memory cell architecture.

Each memory element may supply a corresponding output signal OUT at a corresponding output path 19. In CRAM arrays, each signal OUT is a static output control signal that may be conveyed over a corresponding path 26 and may be used in configuring a corresponding transistor such as transistor 24 or other circuit element in an associated programmable logic circuit.

Integrated circuit 10 may have control circuitry 12 for supplying signals to memory array 17. Control circuitry 12 may receive power supply voltages, data, and other signals from external sources using pins 14 and from internal sources using paths such as paths 16. Control circuitry 12 may include circuitry such as addressing circuitry, data register circuitry, write circuitry, read circuitry, etc. Control circuitry 12 may use the power supply voltages supplied by pins 14 to produce desired time-varying and fixed signals on paths such as paths 20 and 22.

There may, in general, be any suitable number of conductive lines associated with paths 20 and 22. For example, each row of array 17 may have associated address lines (e.g., a true address line and a complement address line) and associated read/write enable lines in a respective one of paths 20 (as examples). Each column of array 17 may have a respective path 20 that includes data lines (e.g., a true data line and a complement data line). A clear signal may be routed to all of the cells in array 17 simultaneously over a common clear line. The clear line may be oriented vertically so that there is one branch of the clear line in each path 22 or may be oriented horizontally so that there is one branch of the clear line in each path 20. The clear line need not be necessary.

Power can also be distributed in this type of global fashion. For example, a positive power supply voltage Vcc may be supplied in parallel to each cell 18 using a pattern of shared horizontal or vertical conductors. A ground voltage Vss may likewise be supplied in parallel to cells 18 using a pattern of shared horizontal or vertical lines. Control lines such as address lines and data lines are typically orthogonal to each other (e.g., address lines are vertical while data lines are horizontal or vice versa).

The terms "rows" and "columns" merely represent one way of referring to particular groups of cells 18 in memory array 17 and may sometimes be used interchangeably. If desired, other patterns of lines may be used in paths 20 and 22. For example, different numbers of power supply signals, data signals, and address signals may be used.

The signals that are supplied to memory elements 18 may sometimes be collectively referred to as control signals. In particular contexts, some of these signals may be referred to as power signals, clear signals, data signals, address signals, etc. These different signal types are not mutually exclusive. For example, a clear signal for array 17 may serve as a type of control (address) signal that can be used to clear array 17. This clear signal may also serve as a type of power signal by powering inverter-like circuitry in cells 18. Likewise, because clearing operations serve to place logic zeros in memory cells 18, clear signals may serve as a type of data signal.

Positive power supply voltage Vcc may be provided over a positive power supply line. Ground voltage Vss may be provided over a ground power supply line. Any suitable values may be used for positive power supply voltage Vcc and ground voltage Vss. For example, positive power supply voltage Vcc may be 1.2 volts, 1.1 volts, 1.0 volts, 0.9 volts, 0.8 volts, less than 0.8 volts, or any other suitable voltage. Ground voltage Vss may be zero volts (as an example). In a typical arrangement, power supply voltages Vcc may be 1.0 volts, Vss may be zero volts, and the signal levels for address, data, and clear signals may range from zero volts (when low) to 1.0 volts (when high). Arrangements in which Vcc varies as a function of time, in which Vss is less than zero volts, and in which control signals are overdriven (i.e., in which control signals have signal strengths larger than Vcc-Vss) may also be used.

Figure 3:
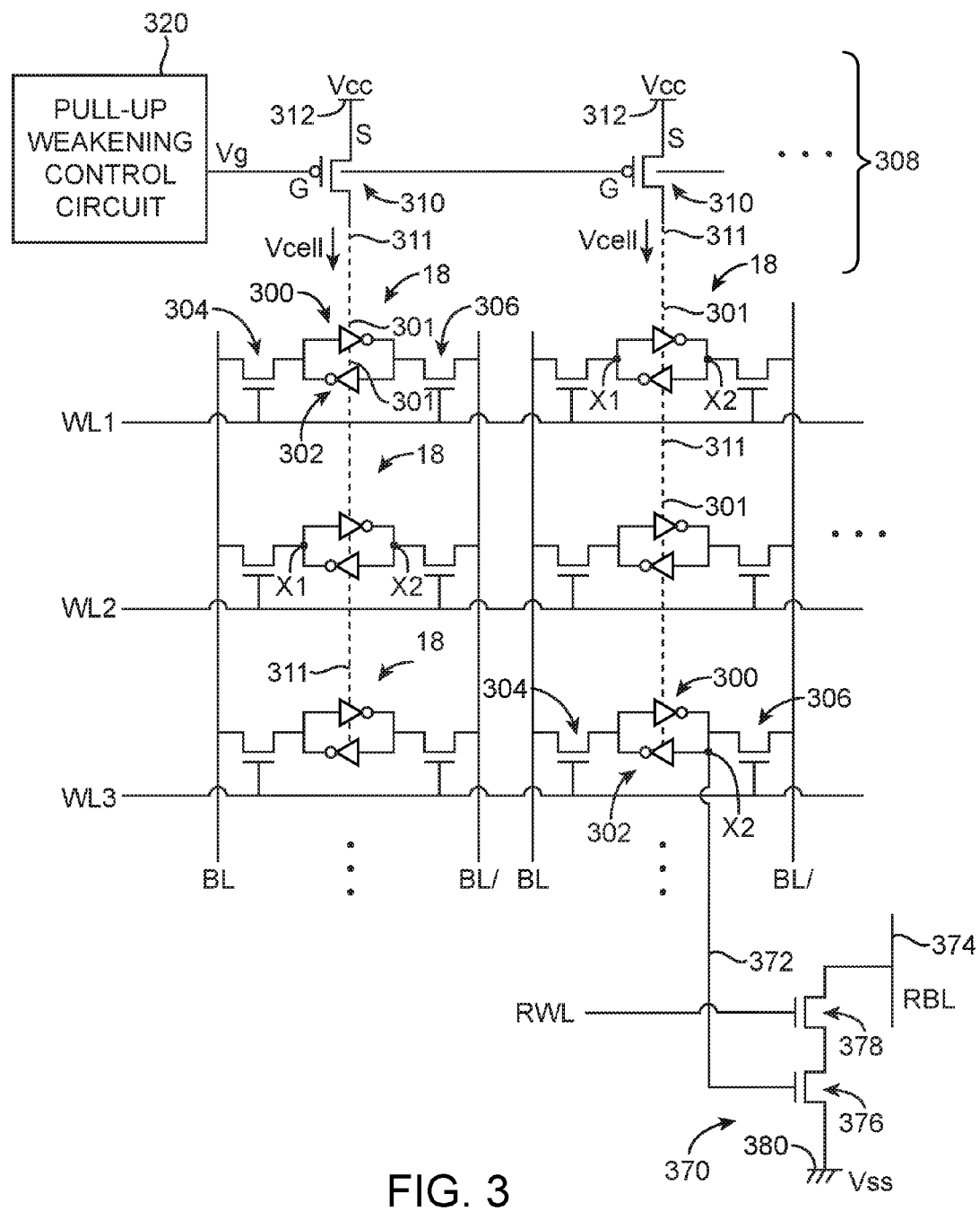
FIG. 3 is a diagram of a memory element array coupled to pull-up weakening circuitry in accordance with an embodiment.

FIG. 3 is a diagram showing an array of memory cells 18 that can be coupled to pull-up weakening circuitry 308. As shown in FIG. 3, memory cells 18 can be arranged into multiple columns. Each column of memory cells 18 may be connected to a respective set of bit lines BL and BL/. Each memory cell 18 may have a storage portion that includes cross-coupled inverting circuits such as inverters 300 and 302 each of which has an input, an output, and at least one power supply terminal 301 (e.g., a positive power supply terminal that is configured to receive memory cell power supply voltage Vcell).

In particular, the input of circuit 300 may be coupled to the output of circuit 302, whereas the input of 302 may be coupled to the output of circuit 300. The output of circuit 300 may serve as a first internal data storage node X1 for cell 18 while the output of circuit 302 may serve as a second internal data storage node X2 for cell 18. The storage portion of cell 18 configured in this way may be used to store a single bit of data (e.g., data storage nodes X1 and X2 may store true and complement versions of a single data bit, respectively). As an example, cell 18 that is storing a high data bit may have data storage nodes X1 and X2 respectively driven to "0" and "1." As another example, cell 18 that is storing a low data bit may have data storage nodes X1 and X2 respectively driven to "1" and "0."

The storage portion of memory cell 18 may be coupled to access transistors (sometimes referred to as memory "address" transistors or memory "pass gate" transistors) such as transistors 304 and 306 to perform read and/or write operations. In the example of FIG. 3, access transistor 304 may be coupled between a first bit line (e.g., a true data line on which true data signal BL is provided) and first data storage node X1, whereas access transistor 306 may be coupled between a second bit line (e.g., a complementary data line on which complement data signal BL/ is provided) and second data storage node X2. Transistors 304 and 306 may each have a gate that is coupled to a word (address) line on which world line signal WL is conveyed. Memory cells 18 arranged along a first row in the memory array may all receive word line signal WL1 via a first address line; memory cells 18 arranged along a second row in the memory array may all receive word line signal WL2 via a second address line; memory cells 18 arranged along a third row in the memory array may all receive word line signal WL3 via a third address line; etc.

During normal operation, the true and complementary bit lines may be nominally driven to zero volts to minimize leakage currents while the word line signals are deasserted (e.g., the address signals may be pulled low to disable access transistors 304 and 306). For example, word line signal WL may be driven to −0.1 V to reduce leakage currents through access transistors 304 and 306. If desired, the word line signals may be driven to −0.2 V or other negative voltages to further reduce leakage through the access transistors.

During write operations, desired data signals may be presented on the first and second bit lines (also referred to as data lines). A selected one of the word line signals may then be asserted to enable corresponding access transistors 304 and 306 to load in a desired value into memory cell 18. As an example, bit line signals BL and BL/may be respectively driven to logic "0" and "1" to load a high data bit into memory cell 18 using the activated pass gates 304 and 306. As another example, bit line signals BL and BL/ may be respectively driven to logic "1" and "0" to load a low data bit into memory cell 18 using the activated pass gates 304 and 306.

The read performance of memory cell 18 may be characterized by a metric commonly referred to as read noise margin or static noise margin (SNM), whereas the write performance of memory cell 18 may be characterized by another metric commonly referred to as write noise margin (WNM). Static noise margin may be dependent on the relative drive strength between the pass gates (e.g., access transistors PG1 and PG2) and any pull-down transistors in the storage portion of memory cell 18. In particular, it may be desirable minimize the ratio of pass gate drive strength to pull-down drive strength so as to optimize static noise margin (e.g., it may be desirable to increase the drive-ability of the pull-down transistors in INV1 and INV2 relative to that of the pass gates to ensure that data does not inadvertently flip during read operations).

On the other hand, write noise margin may be dependent on the relative drive strength between the pass gates and the pull-up current path of memory cell 18. In particular, it may be desirable to maximize the ratio of pass gate drive strength to pull-up drive strength so as to optimize write noise margin (e.g., it may be desirable to increase the resistance of the pull-up current path to ensure that new data can be properly loaded into cell 18 during write operations).

In some embodiments, each memory cell 18 may also be provided with an additional read port such as read circuit 370. As shown in FIG. 3, read circuit 30 may include two pull-down transistors such as n-channel transistor 376 and n-channel transistor 378 coupled in series between a read bit line 374 and a ground line 380 (e.g., a ground power supply line on which ground power supply voltage Vss in provided). Transistor 376 may have a gate terminal that is coupled to output node X2 of associated memory cell 18 via path 372. Transistor 378 may have a gate terminal that receives read word line signal RWL.

Configured in this way, read word line signal RWL (sometimes referred to as a read address signal) can be asserted to perform a read operation on a given memory cell. Prior to assertion of control signal RWL, read bit line signal RBL on read data line 374 may be precharged high. When read word line RWL is asserted and if node X2 is high, read bit line signal RBL will be pulled towards ground through transistors 376 and 378. If node X2 is low, transistor 376 will remain in the off state, and read bit line signal RBL will stay high. Thus, a high read bit line signal RBL represents a low data bit stored on internal node X2, whereas a low read bit line signal RBL represents a high data bit stored on internal node X2.

When a separate read port such as read circuit 370 is used, the read noise margin does not depend on the relative ratio of the pass gate to the pull-down transistor, assuming the write word line signals (e.g., WL1, WL2, WL3, etc.) are all deasserted during a read. However, the read speed will depend on the memory cell power supply level Vcell. In general, a higher Vcell will allow node X2 to be pulled up higher, which turns on transistor 376 more. A lower Vcell, on the other hand, causes node X2 to be lower, which reduces the drive strength of transistor 376 and results in a slower response time for read circuit 370.

In accordance with an embodiment, memory cells 18 may be coupled to pull-up weakening circuitry 308 that is configured to dynamically improve write margins without affecting read performance. Pull-up weakening circuitry 308 may include pull-up weakening switches such as p-channel transistors and a pull-up weakening control circuit such as control circuit 320 that simultaneously controls each of pull-up transistors 310. Each memory cell 18 in a given column may be coupled to a corresponding pull-up weakening transistor 310.

In particular, pull-up weakening transistor 310 may have a source terminal that is connected to positive power supply line 312 (e.g., a power supply terminal on which positive power supply voltage Vcc is provided, a gate terminal that receives control voltage Vg from control circuit 320, and a drain terminal that is connected to the positive power supply terminal 301 of each inverter 300 and inverter 302 in an associated column of memory cells 18 (see, e.g., via path 311). Connected in this way, each pull-up weakening transistor 310 can be used to pass voltage Vcell to a column of memory cells over path 311. Only one pull-up weakening transistor 310 is needed per column (instead of multiple series p-channel transistors that are needed per memory cell, as can be seen in other pull-up weakening techniques), which helps to minimize any area overhead and reduce cost.

Pull-up weakening control circuit 320 may be used to generate pull-up weakening control signal Vg. During read operations, control signal Vg may be driven all the way down to ground voltage Vss (e.g., to zero volts or optionally below ground) to fully turn on transistors 310 so that Vcell is driven up all the way to positive power supply level Vcc. Operated in this way, read performance is not affected by the presence of pull-up weakening transistor 310. This technique, combined with the used of read circuit 370, helps to maximize read noise margins without degrading read speed, which directly allows memory cells to operate at lower voltage levels and can help minimize overall power consumption.

During write operations, control circuit 320 may temporarily adjust signal Vg to an intermediate voltage level (e.g., an intermediate voltage level between positive power supply Vcc and ground power supply Vss) so as to temporarily reduce the drive strength of transistors 310. For example, Vg may be temporarily raised from 0 V to 0.1 V, 0.2 V, 0.5 V, or other analog voltage level during data loading operations. This technique provides a flexible, efficient, and effective way of reducing the pull-up drive strength of the storage portion of each memory cell 18. This scheme is especially helpful when the mobility of p-channel transistors begins to exceed that of n-channel transistors, as can sometimes be observed in newer processing technologies.

Figure 4:
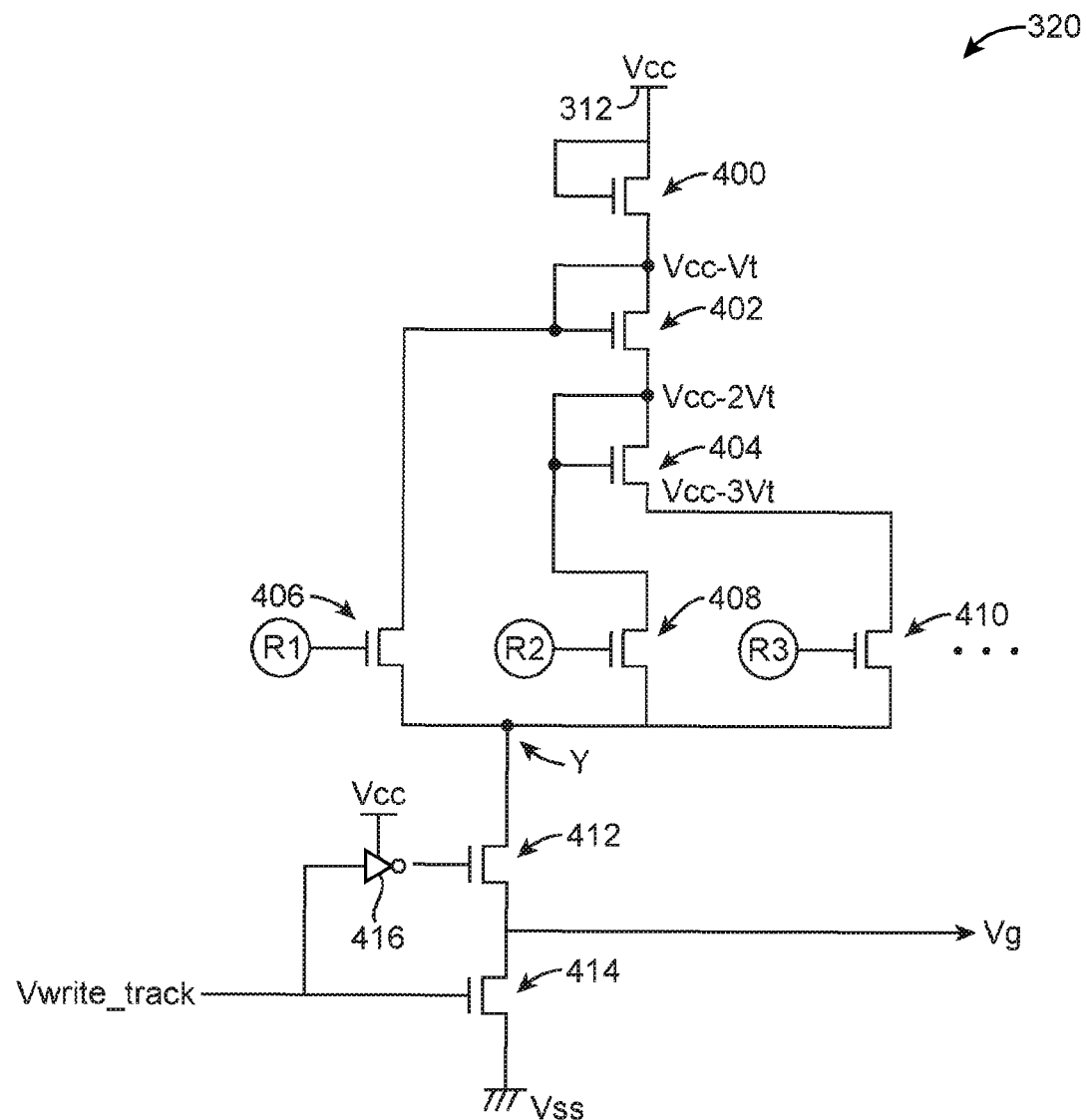
FIG. 4 is a diagram of an illustrative pull-up weakening control circuit in accordance with an embodiment.

FIG. 4 is a circuit diagram of one suitable implementation of pull-up weakening control circuit 320. As shown in FIG. 4, pull-up weakening control circuit 320 may include n-channel transistors such as transistors 400, 402, 404, 406, 408, 410, 412, and 414. Transistor 400 may have a drain terminal that is connected to positive power supply line 312, a gate terminal that is shorted to its drain terminal, and a source terminal. Transistor 402 may have a drain terminal that is connected to the source terminal of transistor 400, a gate terminal that is connected to its drain terminal, and a source terminal. Transistor 404 may have a drain terminal that is connected to the source terminal of transistor 402, a gate terminal that is connected to its drain terminal, and a source terminal.

Transistors 400, 402, and 404 having gate terminals shorted to the drain terminals are sometimes referred to as being in a "diode-connected" configuration. Transistors 400, 402, and 404 may generally be of the same size and may exhibit the same threshold voltage level Vt. Connected in this way, a voltage level of (Vcc minus Vt) may be provided at the source terminal of transistor 400; a voltage level of (Vcc minus 2*Vt) may be provided at the source terminal of transistor 402; and a voltage level of (Vcc minus 3*Vt) may be provided at the source terminal of transistor 404.

Transistor 406 may have a drain terminal that is connected to the gate terminal of transistor 402 (which is also shorted to the source terminal of transistor 400), a source terminal that is connected to an intermediate node Y, and a gate terminal that is coupled to a first random-access memory (RAM) bit cell R1. Transistor 408 may have a drain terminal that is connected to the gate terminal of transistor 404 (which is also shorted to the source terminal of transistor 402), a source terminal that is connected to intermediate node Y, and a gate terminal that is coupled to a second RAM bit cell R2. Transistor 410 may have a drain terminal that is connected to the source terminal of transistor 404, a source terminal that is connected to intermediate node Y, and a gate terminal that is coupled to a third RAM bit cell R3.

Transistors 412 and 414 are coupled in series between node Y and the ground line (e.g., a ground power supply line on which ground voltage Vss is provided). Transistor 414 has a gate terminal that receives write-tracking signal Vwrite_track, whereas transistor 412 has a gate terminal that receives an inverted version of signal Vwrite_track via inverter 416. Inverter 416 may be powered by power supply voltage Vcc. The node at which transistor 412 connects to transistor 414 may serve as the output terminal of control circuit 320 at which pull-up weakening control signal Vg is provided.

Configured in this way, signal Vg will be driven to ground Vss by transistor 414 whenever signal Vwrite_track is high and will be driven to some intermediate voltage level that is greater than ground voltage Vss but less than positive power supply voltage Vcc whenever signal Vwrite_track is low so that pull-up weakening transistors 310 are only partially on—but not completely turned off—during a write operation. The voltage level of signal Vg during the write operation may depend on the value of bits stored in bit cells R1-R3. Only one of cells R1-R3 should store a high bit at any given point in time. If cell R1 is storing a "1," transistor 406 is turned on to pull node Y up to (Vcc−Vt). Instead, if cell R2 is storing a "1," transistor 408 will be turned on to pull node Y up to (Vcc−2*Vt). On the other hand, if cell R3 is storing a "1," transistor 410 is activated to pull node Y up to (Vcc−3*Vt). In general, a higher Vg will provide more pull-up weakening than a relatively lower Vg. Thus, the magnitude of the pull-up weakening can be adjusted by controlling the values stored in elements R1-R3.

The example of FIG. 4 in which only three different adjustable voltage levels are provided at the output terminal is merely illustrative and is not intended to limit the scope of the present embodiments. If desired, circuit 320 may be extended to support less than three different intermediate voltage levels or more than three different intermediate voltage levels.

Figure 5:
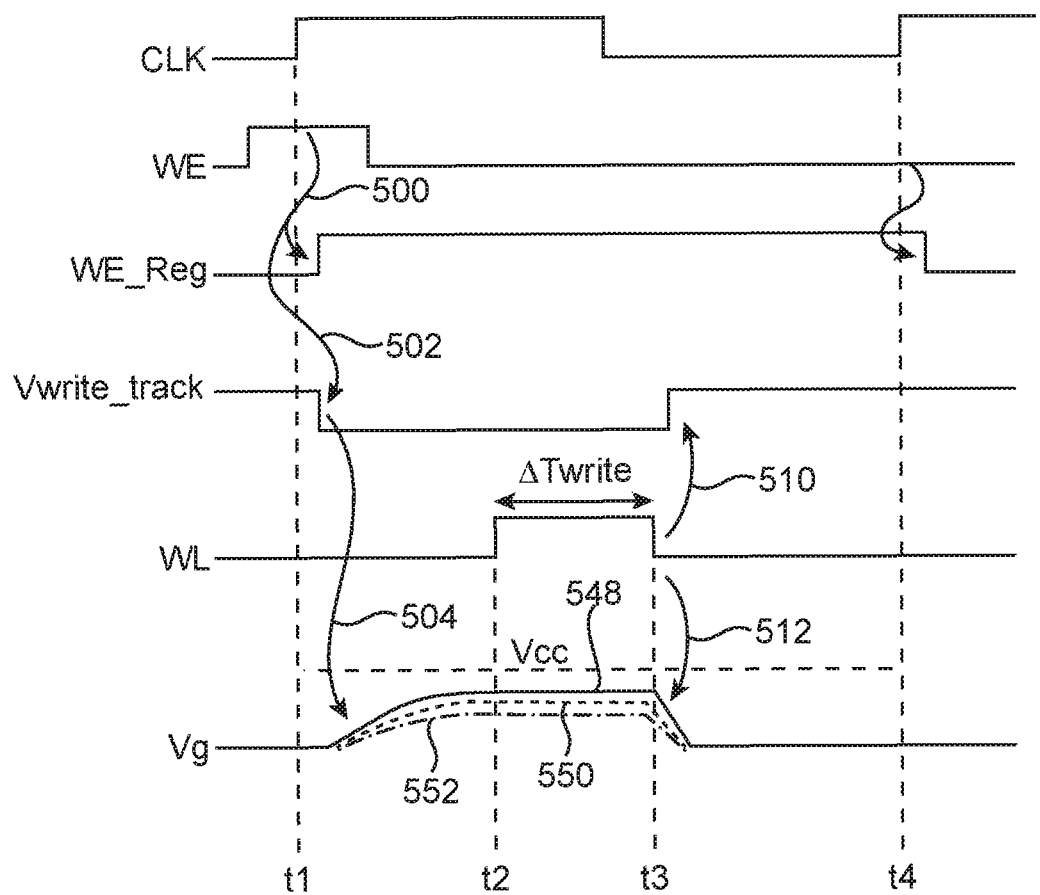
FIG. 5 is a timing diagram illustrating relevant waveforms associated with the operation of the pull-up weakening control circuit shown in FIG. 4 in accordance with an embodiment.

FIG. 5 is a timing diagram illustrating relevant waveforms associated with the operation of pull-up weakening control circuit 320 shown in FIG. 4. FIG. 5 shows a memory clock signal CLK, a write enable signal WE, a registered write enable signal WE_Reg (e.g., a clock-triggered and latched version of signal WE), signal Vwrite_track, write word line signal WL, and pull-up weakening control signal Vg. At time t1, signal CLK rises to sample an asserted write enable signal WE, which causes registered signal WE_Reg and signal Vwrite_track to be driven low (as shown by arrows 500 and 502, respectively). When signal Vwrite_track is driven low (i.e., when signal Vwrite_track is asserted), gate control signal Vg may begin to rise toward a predetermined intermediate voltage level (as indicated by arrow 504).

Write word line signal WL may pulse high at time t2. Signal Vg may have sufficient time between times t1 and t2 to settle at the predetermined voltage level. Depending on the configuration of control circuit 320, signal Vg may reach different voltage levels. In a first configuration, signal Vg may be driven to a first voltage level (as indicated by line 548 when signal WL is high). In a second configuration, signal Vg may be driven to a second voltage level that is less than the first voltage level (as indicated by line 550 when signal WL is asserted). In a third configuration, signal Vg may be driven to a third voltage level that is less than the second voltage level (as indicated by line 552 when signal WL is pulsed high). In general, a higher Vg signal provides more weakening in the pull-up path of the memory cell.

At time t3, word line signal WL may be deasserted (e.g., signal WL may be driven low). The duration between times t2 and t3 can sometimes be referred to as a write period or write window ΔTwrite. When signal WL pulses low, signal Vwrite_track rises high (as indicated by arrow 510), which also causes signal Vg to be driven back down to the ground voltage, as indicated by arrow 512. When signal Vg is driven all the way down to zero volts, the pull-up drive strength of transistors 310 (see FIG. 3) is maximized so that read performance is unaffected by the temporary pull-up weakening.

The operation of FIG. 5 in which signal Vwrite_track is time-varying is sometimes referred to as a "dynamic" pull-up weakening scheme. In other suitable embodiments, a "static" pull-up weakening scheme can also be implemented such that signal Vwrite_track is constantly driven low through normal operation of the memory cell (e.g., signal Vwrite_track may be asserted during write, read, and hold modes). Configured in this way, signal Vg will be fixed at the predetermined intermediate voltage level, which may cause the pull-up drive strength of the memory cells to be reduced even during a read operation.

Figure 6A:
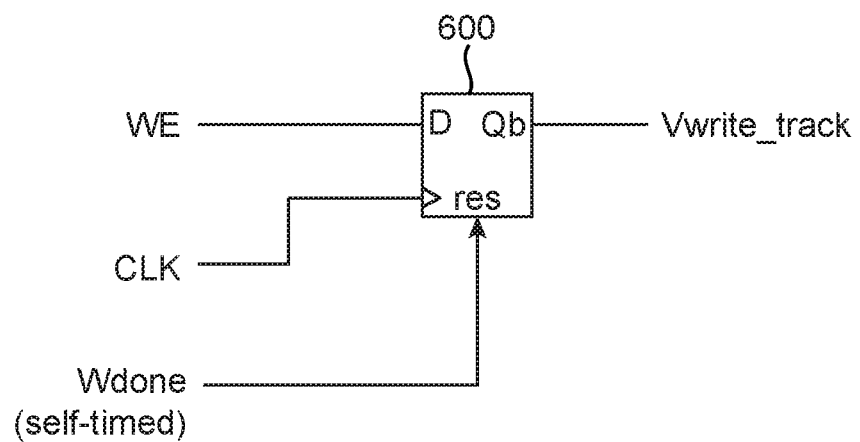
FIG. 6A is a diagram of an illustrative circuit that can be used to generate a write tracking signal in accordance with an embodiment.

FIG. 6A is a diagram of an illustrative circuit that can be used to generate write tracking signal Vwrite_track in accordance with an embodiment. As shown in FIG. 6A, a clock-triggered element such as digital flip-flop 600 may be used output signal Vwrite_track. Flip-flop may include a data input that receives signal write enable signal WE, a clock input that receives memory clock signal CLK, a reset input that receives a write-done signal Wdone, and a data-bar output Qb on which signal Vwrite_track is provided. Data-bar output generates an inverted version of the latched signal at the data input. Signal Wdone is a self-timed signal that is automatically asserted at the end of write period ΔTwrite (see FIGS. 5 and 6B). When signal Wdone is asserted at the reset input of flip-flop 600, signal Vwrite_track will be forced high. The write track signal generator of FIG. 6A is merely illustrative and is not intended to limit the scope of the present embodiments.

Figure 6B:
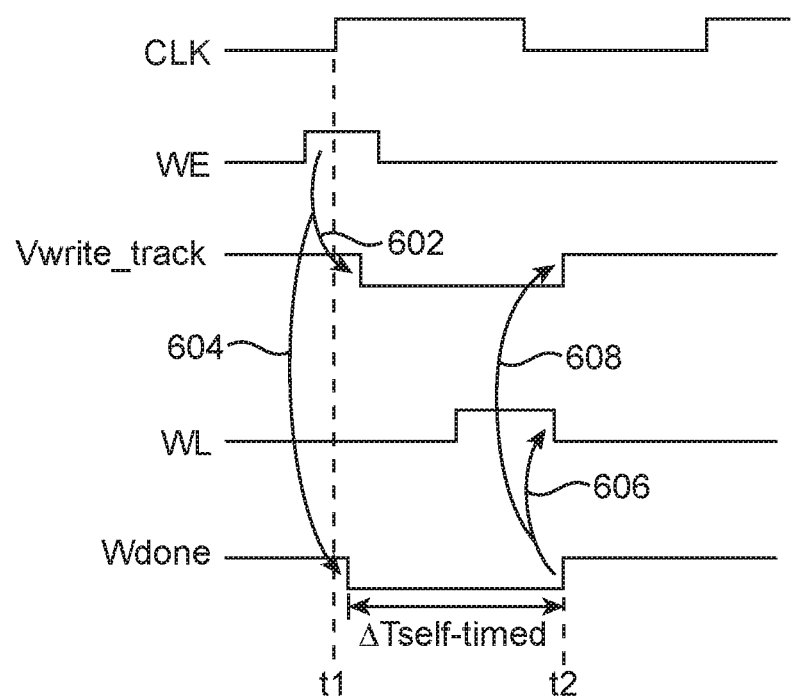
FIG. 6B is a timing diagram illustrating relevant waveforms associated with the operation of the write tracking signal generator circuit shown in FIG. 6A in accordance with an embodiment.

FIG. 6B is a timing diagram illustrating relevant waveforms associated with the operation of the write tracking signal generator circuit shown in FIG. 6A. FIG. 6B shows memory clock signal CLK, write enable signal WE, signal Vwrite_track, write word line signal WL, and write-done signal Wdone. At time t1, signal CLK rises to sample an asserted write enable signal WE, which causes signal Vwrite_track to be reset low at the output of flip-flop 600 (as indicated by arrow 602) and signal Wdone to be pulsed low for a predetermined self-timed period ΔTself-timed (as indicated by arrow 604). The duration of period ΔTself-timed may be timed using a precise counter circuit that is included within control circuit 320 (not shown).

At time t2, signal Wdone rises high, which causes signal WL to be driven low (as indicated by arrow 606) and signal Vwrite_track to be driven high (as indicated by arrow 608). Operated in this way, signal Vwrite_track can be asserted following a rising clock edge at signal CLK, which allows the pull-up weakening circuitry to reach the predetermined intermediate voltage level prior to the rising edge of word line signal WL, and can be deasserted when write word line signal WL falls low at the end of a write operation.

Figure 7:
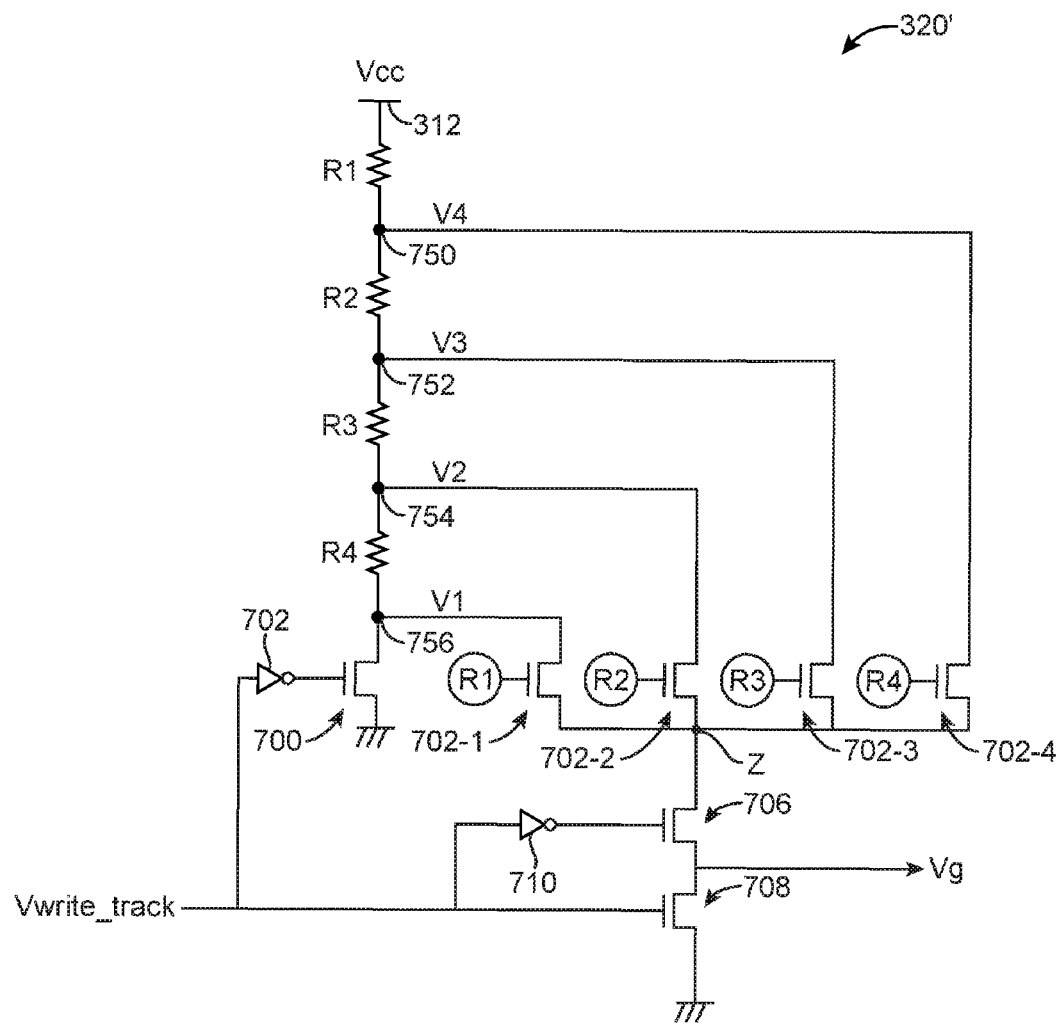
FIG. 7 is a circuit diagram showing a resistor implementation of a pull-up weakening control circuit in accordance with an embodiment.

The circuit implementation of FIG. 4 in which the threshold voltage of stacked n-channel transistors is used to provide different intermediate voltage levels represents one suitable arrangement of pull-up weakening control circuit 320. FIG. 7 shows another suitable arrangement of a pull-up weakening control circuit such as control circuit 320' that is implemented using a resistive chain. As shown in FIG. 7, control circuit 320' may include resistors R1-R4 and n-channel transistors such as transistors 700, 702-1, 702-2, 702-3, 702-4, 706, and 708.

Resistors R1-R4 and transistor 700 may be coupled in series between positive power supply line 312 and the ground line, in that order. Connected in this way, a first predetermined intermediate voltage level V4 may be provided at node 750 coupled between resistors R1 and R2; a second predetermined intermediate voltage level V3 may be provided at node 752 coupled between resistors R2 and R3; a third predetermined intermediate voltage level V2 may be provided at node 754 coupled between resistors R3 and R4; and a fourth predetermined intermediate voltage level V1 may be provided at node 756 coupled between resistor R4 and transistor 700, where voltage level V4>V3>V2>V1 whenever transistor 700 is turned on. Transistor 700 may receive an inverted version of signal Vwrite_track via inverter 702, such that transistor 700 is turned off when Vwrite_track is driven high.

Transistor 702-1 may have a drain terminal that is connected to node 756, a source terminal that is connected to an intermediate node Z, and a gate terminal that is coupled to first RAM bit cell R1. Transistor 702-2 may have a drain terminal that is connected to node 754, a source terminal that is connected to intermediate node Z, and a gate terminal that is coupled to second RAM bit cell R2. Transistor 702-3 may have a drain terminal that is connected to node 752, a source terminal that is connected to intermediate node Z, and a gate terminal that is coupled to third RAM bit cell R3. Transistor 702-4 may have a drain terminal that is connected to node 750, a source terminal that is connected to intermediate node Z, and a gate terminal that is coupled to fourth RAM bit cell R4.

Transistors 706 and 708 are coupled in series between node Z and the ground line (e.g., a ground power supply line on which ground voltage Vss is provided). Transistor 708 has a gate terminal that receives write-tracking signal Vwrite_track, whereas transistor 706 has a gate terminal that receives an inverted version of signal Vwrite_track via inverter 710. The node at which transistor 706 connects to transistor 708 may serve as the output terminal of control circuit 320' at which pull-up weakening control signal Vg is provided.

Configured in this way, signal Vg will be driven to ground Vss by transistor 708 whenever signal Vwrite_track is high and will be driven to some intermediate voltage level that is greater than ground voltage Vss but less than positive power supply voltage Vcc whenever signal Vwrite_track is low so that pull-up weakening transistors 310 are only partially on—but not completely turned off—during a write operation.

The voltage level of signal Vg during the write operation may depend on the value of bits stored in bit cells R1-R4. Only one of cells R1-R4 should store a high bit at any given point in time. If cell R1 is storing a "1," transistor 702-1 is turned on to pull node Z up to V1. Instead, if cell R2 is storing a "1," transistor 702-2 will be turned on to pull node Z up to V2. On the other hand, if cell R3 is storing a "1," transistor 702-3 is activated to pull node Z up to V3. If cell R4 is storing a "1," transistor 702-4 is activated to pull node Z up to V4. In general, a higher Vg will provide more pull-up weakening than a relatively lower Vg. Thus, the magnitude of the pull-up weakening can be adjusted by controlling the values stored in elements R1-R4.

The example of FIG. 7 in which only four different adjustable voltage levels are provided at the output terminal is merely illustrative and is not intended to limit the scope of the present embodiments. If desired, circuit 320' may be extended to support less than four different predetermined intermediate voltage levels or more than four different predetermined intermediate voltage levels.

Figure 8:
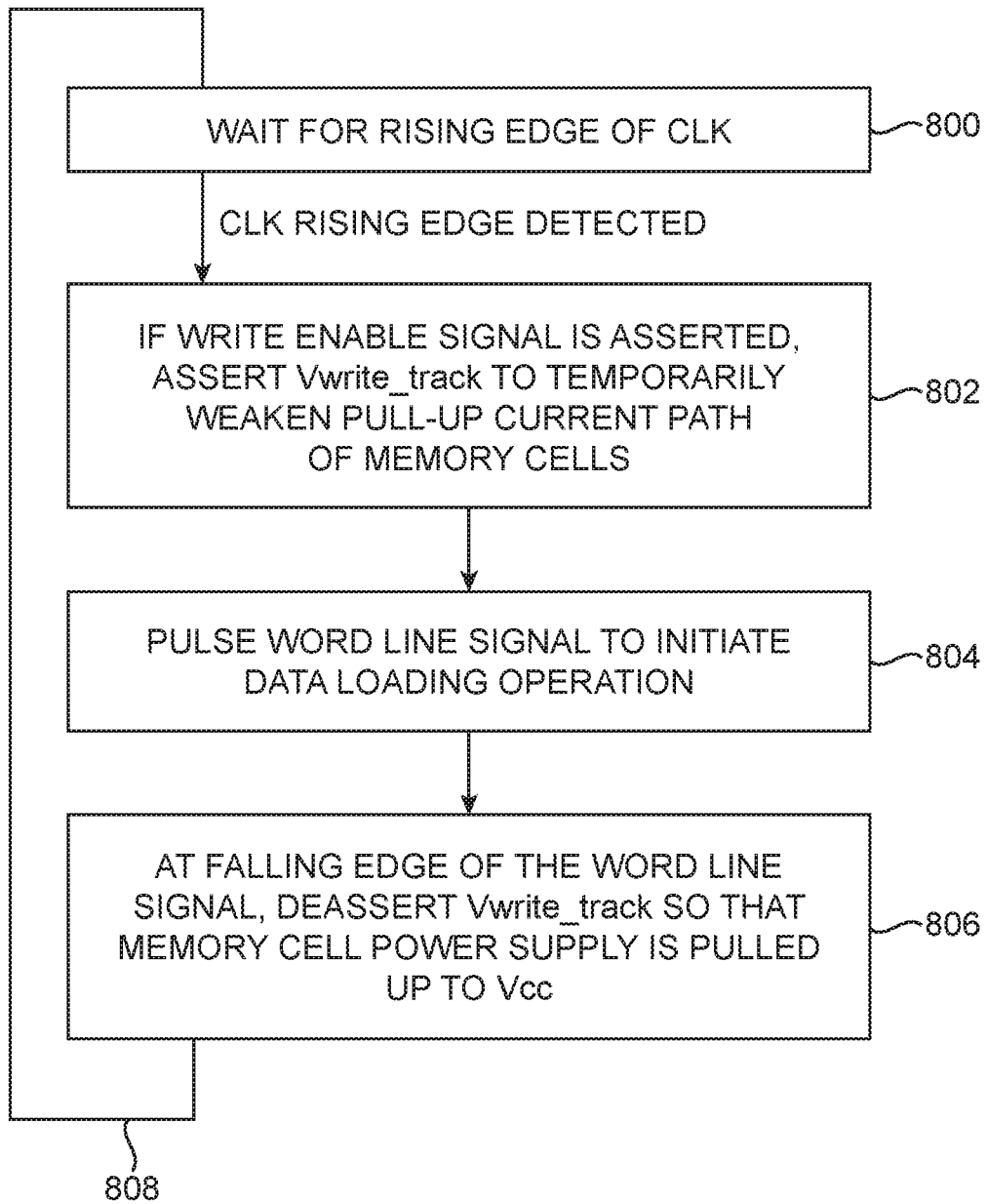
FIG. 8 is a flow chart of illustrative steps involved in operating pull-up weakening circuitry of the type shown in connection with FIGS. 3, 4, and 7 in accordance with an embodiment.

FIG. 8 is a flow chart of illustrative steps involved in operating the pull-up weakening circuitry of the type shown in connection with FIGS. 3, 4, and 7. At step 800, pull-up weakening circuitry 308 may wait for a rising edge of signal CLK. When the rising edge of signal CLK is detected, step 802 may be performed. At step 802, if write enable signal WE is asserted, write track signal Vwrite_track may be asserted to temporarily weaken the pull-up current path of each memory cell (e.g., by driving signal Vg to a desired predetermined voltage level to weaken pull-up transistors 310).

At step 804, write word line signal WL may be pulsed high to initiate a data loading operation. At the falling edge of word line signal WL, signal Vwrite_track may be deasserted so that the memory cell power supply voltage Vcell is pulled all the way up to positive power supply Vcc so that read performance is optimized (step 806). Processing may then loop back to step 800 to monitor for the next write cycle, as indicated by path 808.

These steps are merely illustrative. The existing steps may be modified or omitted, additional steps may be added, and the order of certain steps may be altered without departing from the scope of the present embodiments.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IC circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA Corporation.

The foregoing is merely illustrative of the principles of this invention and various modifications can be made by those skilled in the art. The foregoing embodiments may be implemented individually or in any combination.

What is claimed is:

1. An integrated circuit, comprising:
a pair of bit lines;
a column of memory cells coupled to the pair of bit lines, wherein each memory cell in the column of memory cells includes cross-coupled inverters with positive power supply terminals, and wherein the positive power supply terminals of each memory cell in the column of memory cells are coupled to only a first pull-up transistor having a gate terminal that receives an adjustable control signal; and
a pull-up weakening control circuit that outputs the adjustable control signal, the pull-up weakening control circuit drives the adjustable control signal to a ground power supply level during read operations and temporarily elevates the adjustable control signal above the ground power supply level during write operations.

2. The integrated circuit of claim 1, further comprising:
an additional pair of bit lines; and
an additional column of memory cells coupled to the additional pair of bit lines, wherein each memory cell in the additional column of memory cells includes cross-coupled inverters with positive power supply terminals, and wherein the positive power supply terminals of each memory cell in the additional column of memory cells are coupled to only a second pull-up transistor having a gate terminal that receives the adjustable control signal.

3. The integrated circuit of claim 1, further comprising:
a positive power supply line that is directly connected to the first pull-up transistor, wherein the first pull-up transistor comprises a p-channel transistor.

4. The integrated circuit of claim 1, wherein the pull-up weakening control circuit includes a chain of diode-connected n-channel transistors connected in series.

5. The integrated circuit of claim 4, wherein each diode-connected n-channel transistor in the chain has a gate terminal and a drain terminal that are shorted together.

6. The integrated circuit of claim 4, wherein the pull-up weakening control circuit further includes:
a first transistor with a drain terminal that is connected to only a first diode-connected n-channel transistor in the chain; and
a second transistor with a drain terminal that is connected to only a second diode-connected n-channel transistor in the chain that is different from the first diode-connected n-channel transistor.

7. The integrated circuit of claim 6, further comprising:
a first configuration memory element that provides a static control bit to a gate terminal of the first transistor; and
a second configuration memory element that provides a static control bit to a gate terminal of the second transistor.

8. The integrated circuit of claim 4, wherein the pull-up weakening control circuit includes a chain of resistors connected in series.

9. The integrated circuit of claim 8, wherein the pull-up weakening control circuit further includes:
a first transistor having a drain terminal that is connected to only a first intermediate node between first and second resistors in the chain and a source terminal; and
a second transistor having a drain terminal that is connected to only a second intermediate node between the second resistor and a third resistor in the chain and a source terminal that is shorted to the source terminal of the first transistor.

10. A method of operating an integrated circuit having a pull-up transistor that is shared among a column of memory cells, the method comprising:
with a pull-up weakening control circuit, outputting a control signal at a ground power supply voltage level to the pull-up transistor during read operations; and
with the pull-up weakening control circuit, temporarily adjusting the control signal to be different than the ground power supply voltage level during write operations.

11. The method of claim 10, further comprising:
generating a write track signal to control the pull-up weakening control circuit.

12. The method of claim 11, wherein generating the write track signal comprises using a flip-flop to generate the write track signal.

13. The method of claim 12, wherein using the flip-flop to generate the write track signal comprises using the flip-flop to receive a write enable signal, a clock signal, and a self-timed write done signal.

14. The method of claim 12, further comprising:
adjusting the control signal to a first predetermined voltage level during the write operations when the pull-up weakening control circuit is configured in a first state; and
adjusting the control signal to a second predetermined voltage level that is different than the first predetermined voltage level during the write operations when the pull-up weakening control is configured in a second state.

15. An integrated circuit, comprising:
a group of memory cells each of which includes inverting circuits having power supply terminals;
a single pull-up transistor that is coupled to the power supply terminals of the inverters in each memory cell in the group of memory cells, wherein the pull-up transistor is shared among the group of memory cells; and
a pull-up weakening control circuit that is configured to output a control signal at a first predetermined voltage level to the pull-up transistor in a first mode and that is configured to output the control signal at a second predetermined voltage level that is different than the first predetermined voltage level to the pull-up transistor in a second mode during write operations.

16. The integrated circuit of claim 15, further comprising:
an additional group of memory cells each of which includes inverting circuits having power supply terminals; and
another single pull-up transistor that is coupled to the power supply terminals of the inverters in each memory cell in the additional group of memory cells, wherein the another pull-up transistor is shared among the additional group of memory cells, and wherein the another pull-up transistor also receives the control signal generated by the pull-up weakening control circuit.

17. The integrated circuit of claim 15, wherein the pull-up weakening control circuit includes a chain of diode-connected n-channel transistors connected in series.

18. The integrated circuit of claim 15, wherein the pull-up weakening control circuit includes a chain of resistors connected in series.

19. The integrated circuit of claim 15, wherein the pull-up weakening control circuit comprises:
- a first transistor with a source terminal;
- a second transistor with a source terminal that is shorted to the source terminal of the first transistor;
- a first memory element that provides a first control bit to the first transistor;
- a second memory element that provides a second control bit to the second transistor, wherein only the first control bit is asserted in the first mode and wherein only the second control bit is asserted in the second mode;
- a third transistor; and
- a fourth transistor coupled in series with the third transistor between the source terminal of the first transistor and a ground line, wherein the third transistor receives a write track signal, and wherein the fourth transistor receives an inverted version of the write track signal.

* * * * *